US011411086B2

United States Patent
Chen et al.

(10) Patent No.: US 11,411,086 B2
(45) Date of Patent: Aug. 9, 2022

(54) FIELD PLATE AND ISOLATION STRUCTURE FOR HIGH VOLTAGE DEVICE

(71) Applicant: Taiwan Semiconductor Manufacturing Co., Ltd., Hsin-Chu (TW)

(72) Inventors: Kaochao Chen, Hsin-Chu (TW); Chia-Cheng Ho, Hsinchu (TW); Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 173 days.

(21) Appl. No.: 16/821,247

(22) Filed: Mar. 17, 2020

(65) Prior Publication Data

US 2021/0296451 A1    Sep. 23, 2021

(51) Int. Cl.
*H01L 29/66* (2006.01)
*H01L 29/40* (2006.01)
*H01L 21/3105* (2006.01)
*H01L 21/768* (2006.01)
*H01L 29/06* (2006.01)
*H01L 29/16* (2006.01)
*H01L 29/78* (2006.01)

(52) U.S. Cl.
CPC ...... *H01L 29/402* (2013.01); *H01L 21/31053* (2013.01); *H01L 21/76829* (2013.01); *H01L 29/0653* (2013.01); *H01L 29/1608* (2013.01); *H01L 29/7816* (2013.01)

(58) Field of Classification Search
CPC .......... H01L 29/402; H01L 21/31053; H01L 21/76829; H01L 29/0653; H01L 29/1608; H01L 29/7816
See application file for complete search history.

(56) References Cited

U.S. PATENT DOCUMENTS

| | | |
|---|---|---|
| 2007/0278568 A1 | 12/2007 | Williams et al. |
| 2010/0032758 A1 | 2/2010 | Wang et al. |
| 2013/0093012 A1 | 4/2013 | Zhang et al. |
| 2013/0134512 A1 | 5/2013 | Cheng et al. |
| 2019/0088777 A1* | 3/2019 | Lu ............... H01L 29/66659 |
| 2019/0096740 A1 | 3/2019 | Tsai et al. |

(Continued)

FOREIGN PATENT DOCUMENTS

TW    201941428 A    10/2019

*Primary Examiner* — Victor A Mandala
*Assistant Examiner* — Colleen E Snow
(74) *Attorney, Agent, or Firm* — Eschweiler & Potashnik, LLC

(57) ABSTRACT

An integrated chip includes a field plate overlying an isolation structure. A gate electrode overlies a substrate between a source region and a drain region. An etch stop layer laterally extends from an upper surface of the gate electrode to a front-side of the substrate. The etch stop layer overlies a drift region disposed between the source region and the drain region. The field plate is disposed within a first inter-level dielectric (ILD) layer overlying the substrate. The field plate extends from a top surface of the first ILD layer to an upper surface of the etch stop layer. The isolation structure is disposed within the substrate and extends from the front-side of the substrate to a point below the front-side of the substrate. The isolation structure is disposed laterally between the gate electrode and the drain region.

20 Claims, 9 Drawing Sheets

(56) References Cited

U.S. PATENT DOCUMENTS

| | | |
|---|---|---|
| 2019/0189779 A1 | 6/2019 | Li et al. |
| 2019/0288112 A1 | 9/2019 | Wang et al. |
| 2020/0013888 A1 | 1/2020 | Su et al. |
| 2021/0104630 A1* | 4/2021 | Chung ................ H01L 29/0886 |

* cited by examiner

US 11,411,086 B2

FIELD PLATE AND ISOLATION STRUCTURE FOR HIGH VOLTAGE DEVICE

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
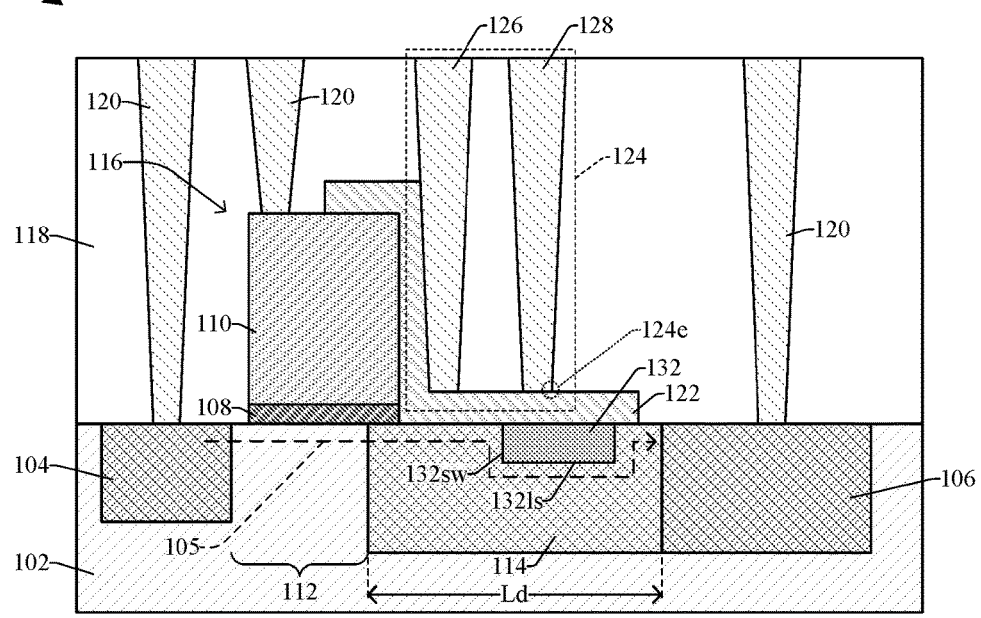
FIG. 1 illustrates a cross-sectional view of some embodiments of a high voltage transistor device having a field plate over a buried isolation structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a drift region of a high voltage transistor device to enhance the performance of the device by manipulating electric fields (e.g., reducing peak electric fields) generated by a gate electrode. By manipulating the electric field generated by the gate electrode, the high voltage transistor device can achieve higher breakdown voltages. For example, LDMOS (laterally diffused metal oxide semiconductor) transistor devices often comprise field plates that extend from a channel region to an adjacent drift region disposed between the channel region and a drain region.

In an effort to increase a number of high voltage transistor devices disposed over/on a single substrate, a distance between the gate electrode and the drain region is reduced such that a lateral distance of the drift region is reduced. Thus, more high voltage transistors devices may be disposed laterally adjacent to one another over the single substrate. Further, by reducing the lateral distance of the drift region, a resistance of the high voltage transistor device may be reduced. However, as the lateral distance of the drift region is reduced, the electric fields generated by the gate electrode may accumulate at an edge of the field plate that is adjacent to the drain region. This accumulation of the electric fields may damage a crystal lattice of the substrate (e.g., a crack in the substrate), thereby resulting in device failure and/or substantially increasing a resistance of the drift region. Further, the accumulation of electric fields at the edge of the field plate may adversely affect the transfer of charge carriers (e.g., electrons) from the source region to the drain region, thereby reducing a performance of the high voltage transistor device.

Accordingly, the present disclosure relates to a high voltage transistor device having a field plate over a buried isolation structure disposed within the drift region. In some embodiments, the high voltage transistor device has a gate electrode overlying a substrate between a source region and a drain region located within the substrate. A contact etch stop layer (CESL) extends from a sidewall of the gate electrode to a drift region arranged between the gate electrode and the drain region. A field plate is located within a first inter-level dielectric (ILD) layer overlying the substrate. The field plate is disposed laterally between the sidewall of the gate electrode and the drain region and vertically extends from the CESL to an upper surface of the first ILD layer. Further, the buried isolation structure is disposed within the drift region laterally between the sidewall of the gate electrode and the drain region. An edge of the field plate directly overlies the buried isolation structure, such that it is separated from the isolation structure by the CESL. During operation of the high voltage transistor device, electric fields generated by the gate electrode may accumulate at the edge of the field plate overlying the buried isolation structure. The buried isolation structure is configured to mitigate and/or prevent damage to the substrate due to the accumulation of electric fields. Further, the buried isolation structure may mitigate and/or prevent the accumulated electric field from adversely affecting the transfer of charge carriers (e.g., electrons) from the source region to the drain region. Therefore, a stability, endurance, and/or performance of the high voltage transistor device is increased while facilitating an increase in a number of high voltage transistor devices that may be disposed over/on the substrate.

FIG. 1 illustrates a cross-sectional view of some embodiments of a high voltage transistor device 100 having a field plate 124 over an isolation structure 132 that is disposed within a substrate 102.

The high voltage transistor device 100 includes a source region 104 and a drain region 106 disposed within the substrate 102. The substrate 102 has a first doping type (e.g., p-type), while the source and drain regions 104, 106 respectively have a second doping type (e.g., n-type), with a higher doping concentration than the substrate 102. In some embodiments, the first doping type may be p-type and the second doping type may be n-type, or vice versa.

A gate structure 116 overlies the substrate 102 at a position that is laterally arranged between the source region 104 and the drain region 106. The gate structure 116 includes a gate electrode 110 that is separated from the substrate 102 by a gate dielectric layer 108. Upon receiving a bias voltage, the gate electrode 110 is configured to generate an electric field that controls the movement of charge carriers (e.g., electrons) within a channel region 112 laterally disposed between the source region 104 and the drain region 106. For example, during operation, a gate-source voltage can be selectively applied to the gate electrode 110 relative to the source region 104, thereby forming a conductive channel in the channel region 112. While the gate-source voltage is applied to form the conductive channel, a drain to source voltage is applied to move charge carriers (e.g., shown by arrow 105) between the source region 104 and the drain region 106. The channel region 112 laterally extends from the source region 104 to an adjacent drift region 114 (or, "drain extension region"). The drift region 114 comprises the second doping type (e.g., n-type) having a relatively low doping concentration, which provides for a higher resistance at high operating voltages. The gate structure 116 is disposed over the channel region 112. In some embodiments, the gate structure 116 may extend from over the channel region 112 to a position overlying a portion of the drift region 114.

An etch stop layer 122 is disposed over the gate structure 116 and an upper surface of the substrate 102. The etch stop layer 122 extends from an upper surface of the gate electrode 110 along a sidewall of the gate electrode 110 and a sidewall of the gate dielectric layer 108 to the upper surface of the substrate 102. A first inter-level dielectric (ILD) layer 118 overlies the substrate 102. One or more conductive structures are disposed within the first ILD layer 118. In some embodiments, the one or more conductive structures comprise a plurality of contacts 120 configured to provide for a vertical connection between the source region 104, the drain region 106, and/or the gate electrode 110 and a plurality of back-end-of-the-line (BEOL) conductive wires (not shown) overlying the contacts 120 and disposed within a second ILD layer (not shown).

The one or more conductive structures may further comprise a field plate 124 disposed within the first ILD layer 118 at a position laterally between the drain region 106 and the gate electrode 110. In some embodiments, the field plate 124 comprises a first field plate structure 126 and a second field plate structure 128. In further embodiments, the field plate 124 comprises a metal material different from the gate electrode 110. In yet further embodiments, the field plate 124 comprises a same metal material as the contacts 120. The field plate 124 is disposed over the etch stop layer 122, in which the etch stop layer 122 is configured to separate the field plate 124 from the drift region 114 and the gate electrode 110. In some embodiments, the field plate 124 may be configured to lower a breakdown voltage of the high voltage transistor device 100 and/or lower a resistance of the drift region 114.

Further, the isolation structure 132 is disposed within the drift region 114, such that an upper surface of the isolation structure 132 is aligned with an upper surface of the substrate 102. In some embodiments, the isolation structure 132 comprises a dielectric material (e.g., silicon dioxide, silicon nitride, silicon carbide, another suitable dielectric material, or any combination of the foregoing) different from a material of the substrate 102. In some embodiments, the isolation structure 132 comprises or is a first material (e.g., silicon dioxide) and the etch stop layer 122 comprises or is a different second material (e.g., silicon carbide, silicon nitride, etc.). The field plate 124 overlies the isolation structure 132 and is separated from the isolation structure 132 by the etch stop layer 122. An edge 124e of the field plate 124 directly overlies the isolation structure 132, in which the edge 124e is separated from the drain region 106 by a first distance. In some embodiments, the first distance is a shortest distance between the field plate 124 and the drain region 106. In further embodiments, a bottom surface of the second field plate structure 128 is spaced laterally between outer sidewalls of the isolation structure 132.

During operation, the field plate 124 is configured to act upon the electric field generated by the gate electrode 110. The field plate 124 may be configured to change distribution of the electric field generated by the gate electrode 110 in the drift region 114. This, in part, enhances the breakdown voltage capability of the high voltage transistor device 100. In some embodiments, a lateral distance Ld of the drift region 114 is reduced in order to increase a number of high voltage transistor devices that may be disposed within/over the substrate 102. In such embodiments, as the lateral distance Ld of the drift region 114 is reduced, the electrical field generated by the gate electrode 110 may accumulate at the edge 124e of the field plate 124. This accumulation may be due to the tendency of electrons to congregate near edges/corners on outer surfaces of conductive bodies and/or because the edge 124e is a nearest portion of the field plate 124 to the drain region 106. Because the isolation structure 132 comprises the dielectric material different from the material of the substrate 102, the isolation structure 132 may not be adversely affected by the high electric field that accumulates at and/or near the edge 124e of the field plate 124. Thus, the lateral distance Ld of the drift region 114 may be reduced while preventing damage to a crystal lattice of the substrate 102. This in part increases a reliability and endurance of the high voltage transistor device 100.

In further embodiments, during operation of the high voltage transistor device 100, current may flow along a shortest path between the source region 104 and the drain region 106 (e.g., illustrated by the arrow 105). Because the isolation structure 132 comprises the dielectric material different from the material of the substrate 102, the current will travel around the isolation structure 132. Thus, the current may flow around a sidewall 132sw of the isolation structure 132 and may flow parallel to a lower surface 132ls of the isolation structure 132. This, in turn, may increase a resistance of the drift region 114. However, the field plate 124 is configured to reduce the lateral distance Ld of the drift region 114, such that the resistance of the drift region 114 is decreased. In some embodiments, the increase in resistance of the drift region 114 due to the isolation structure 132 may be eliminated and/or mitigated by the decrease in resistance of the drift region 114 due to the field plate 124. Further, in some embodiments, by virtue of the current traveling around the isolation structure 132, the accumulation of the electric field at the edge 124e of the field plate 124 may not adversely affect the path (e.g., represented by arrow 105) and/or flow of the current between the source region 104 and the drain region 106. This in turn may further increase the breakdown voltage of the high voltage transistor device 100.

Figure 2:
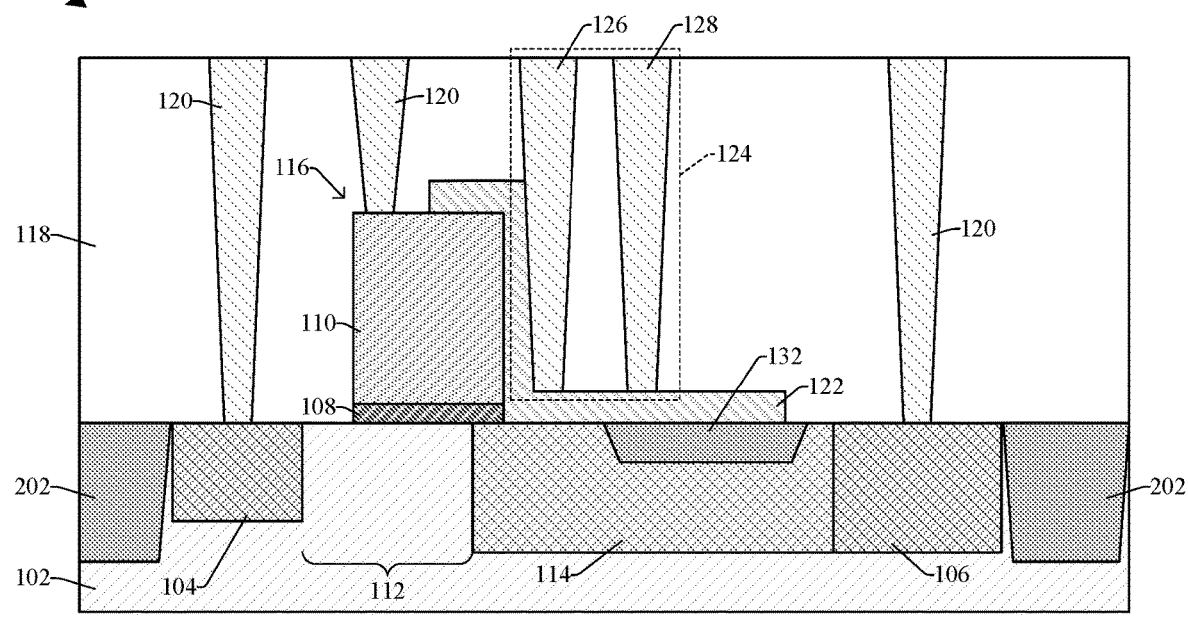
FIG. 2 illustrates a cross-sectional view of some alternative embodiments of the high voltage transistor of FIG. 1.

FIG. 2 illustrates a cross-sectional view of some additional embodiments of a high voltage transistor device including a high voltage laterally diffused MOSFET (LDMOS) device 200 having a field plate 124 overlying an isolation structure 132.

The LDMOS device 200 includes a source region 104 and a drain region 106 disposed within a substrate 102. In some embodiments, the substrate 102 may, for example, be a bulk substrate (e.g., a bulk silicon substrate), a silicon-on-insulator (SOI) substrate, or some other suitable substrate. The substrate 102 has a first doping type (e.g., p-type), while the source region 104 and the drain region 106 respectively comprise highly doped regions having a second doping type (e.g., n-type) different than the first doping type. In some embodiments, the first doping type may be p-type and the second doping type may be n-type, or vice versa. In some embodiments, the source region 104 and/or the drain region 106 may each have doping concentrations of about $2.5*10^{17}$ atoms/cm$^3$, $2.88*10^{17}$ atoms/cm$^3$, $5.5*10^{17}$ atoms/cm$^3$, within a range of about $10^{17}$-$10^{19}$ atoms/cm$^3$, greater than about $10^{19}$ atoms/cm$^3$, or some other suitable doping concentration. In some embodiments, the p-type dopants of the first doping type may, for example, be or comprise boron, difluoroboron (e.g., $BF_2$), indium, some other suitable p-type dopants, or any combination of the foregoing. In various embodiments, the n-type dopants of the second doping type may, for example, be or comprise phosphorous, arsenic, antimony, some other suitable n-type dopants, or any combination of the foregoing.

The drain region 106 abuts a drift region 114 that is arranged within the substrate 102. The drift region 114 comprises the second doping type (e.g., n-type) having a relatively low doping concentration, which provides for a high resistance when the LDMOS device 200 is operated at a high voltage. In some embodiments, the drift region 114 may have a doping concentration that is about $2.0*10^{14}$ atoms/cm$^3$, $2.5*10^{14}$ atoms/cm$^3$, $3.0*10^{14}$ atoms/cm$^3$, $5.7*10^{14}$ atoms/cm$^3$, or within a range of about $10^{18}$ to $10^{20}$ atoms/cm$^3$. Further, a shallow trench isolation (STI) structure 202 extends from a top surface of the substrate 102 to a point below the top surface of the substrate 102. The drain region 106 may abut the STI structure 202. The STI structure 202 is configured to electrically isolate the LDMOS device 200 from adjacent semiconductor devices (not shown). In some embodiments, the STI structure 202 comprises a dielectric material different than a semiconductor substrate material of the substrate 102. In further embodiments, the dielectric material may, for example, be or comprise silicon dioxide, silicon nitride, silicon carbide, silicon oxy-carbide, silicon oxy-nitride, another suitable dielectric material, or any combination of the foregoing. In yet further embodiments, the semiconductor substrate material may, for example, be or comprise silicon, monocrystalline silicon, or some other suitable semiconductor substrate material.

A gate structure 116 is disposed over the substrate 102 at a position that is laterally arranged between the source region 104 and the drain region 106. In some embodiments, the gate structure 116 may laterally extend from over a channel region 112 to a position overlying a portion of the drift region 114. The gate structure 116 includes a gate electrode 110 that is separated from the substrate 102 by a gate dielectric layer 108. In some embodiments, the gate dielectric layer 108 may, for example, be or comprise silicon dioxide, a high-k dielectric material, or the like. As used herein, a high-k dielectric material is a dielectric material with a dielectric constant greater than 3.9. In some embodiments, the gate electrode 110 comprises polysilicon and/or a metal gate material (e.g., tungsten, titanium, tantalum, and/or aluminum).

An etch stop layer 122 extends along an upper surface of the gate electrode 110, a sidewall of the gate electrode 110, a sidewall of the gate dielectric layer 108, and a top surface of the substrate 102. In some embodiments, the etch stop layer 122 continuously extends from the gate electrode 110, over the drift region 114, to a point beyond sidewalls of the field plate 124. In further embodiments, the etch stop layer 122 may, for example, be or comprise silicon nitride, silicon carbide, another suitable material, or the like. Further, a first inter-level dielectric (ILD) layer 118 overlies the substrate 102 and the gate structure 116. A plurality of contacts 120 overlie the substrate 102 and extend through the first ILD layer 118. In some embodiments, the first ILD layer 118 may, for example, be or comprise silicon dioxide, a low-k dielectric material, an extreme low-k dielectric material, another suitable dielectric material, or any combination of the foregoing. In further embodiments, the plurality of contacts 120 may, for example, be or comprise aluminum, copper, tungsten, titanium, another suitable conductive material, or any combination of the foregoing.

The field plate 124 vertically extends from the etch stop layer 122 to a top surface of the first ILD layer 118. In some embodiments, a top surface of the field plate 124 is aligned with a top surface of the plurality of contacts 120. In further embodiments, the field plate 124 may include a first field plate structure 126 and a second field plate structure 128. In some embodiments, the first and second field plate structures 126, 128 may be or comprise a same material and/or are laterally separated from one another by a non-zero distance. The first field plate structure 126 may directly contact a sidewall of the etch stop layer 122. Sidewalls of the field plate 124 are surrounded by the first ILD layer 118. In some embodiments, the field plate 124 may comprise a same material as the contacts 120. In various embodiments, the first and/or second field plate structures 126, 128 may, for example, be or comprise aluminum, copper, tungsten, titanium, another suitable conductive material, or any combination of the foregoing.

The isolation structure 132 is disposed beneath the field plate 124 and is disposed within the drift region 114. The isolation structure 132 may be or comprise a dielectric material different than a semiconductor substrate material of the substrate 102. In some embodiments, the isolation structure 132 comprises a same dielectric material as the STI structure 202. In further embodiments, the dielectric material may, for example, be or comprise silicon dioxide, silicon nitride, silicon carbide, silicon oxy-nitride, silicon oxy-carbide, some other suitable dielectric material, or any combination of the foregoing. The isolation structure 132 directly underlies the second field plate structure 128, such that the isolation structure 132 is separated from the second field plate structure 128 by the etch stop layer 122. In some embodiments, an outer sidewall of the isolation structure 132 extends laterally past an outer sidewall of the etch stop layer 122. The isolation structure 132 is configured to prevent and/or mitigate damage to the substrate 102 due to a buildup of an electric field at an edge of the field plate 124. In further embodiments, outer sidewalls of the isolation structure 132 are slanted.

Figure 3A:
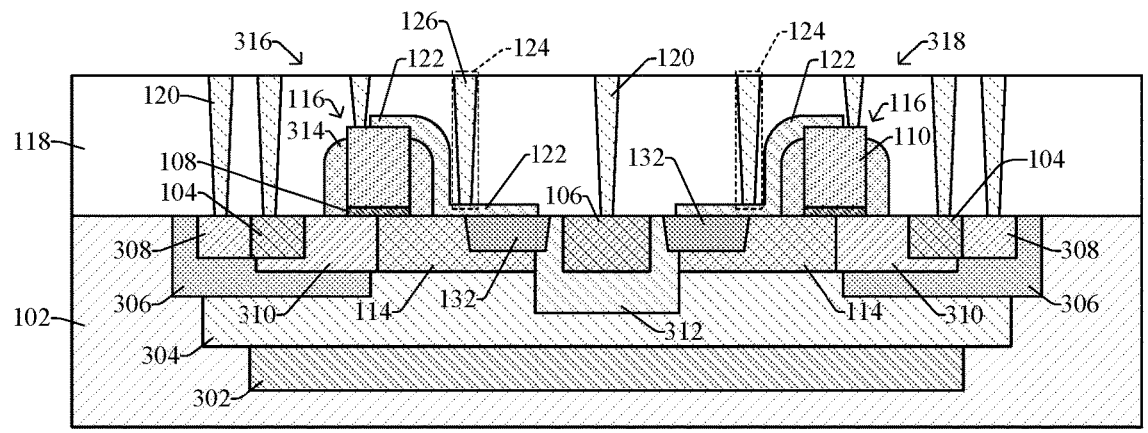
FIGS. 3A-3F illustrate cross-sectional views of various alternative embodiments of an integrated chip including a high voltage laterally diffused metal-oxide semiconductor field-effect transistor (MOSFET) (LDMOS) device having a field plate overlying a buried isolation structure.

FIG. 3A illustrates a cross-sectional view of some embodiments of an integrated chip 300a comprising a first laterally diffused metal-oxide semiconductor field-effect transistor (MOSFET) (LDMOS) device 316 and a second LDMOS device 318 each having a field plate 124 overlying an isolation structure 132.

The first LDMOS device 316 and the second LDMOS device 318 are disposed laterally adjacent to one another and share a drain region 106. Further, the first and second LDMOS devices 316, 318 each comprise a gate structure 116 and a sidewall spacer structure 314 laterally surrounding sidewalls of the gate structure 116. In some embodiments, the sidewall spacer structure 314 may, for example, be or comprise silicon nitride, silicon carbide, another suitable material, or any combination of the foregoing. The gate structure 116 includes a gate electrode 110 overlying a gate dielectric layer 108 that overlies a substrate 102. An etch stop layer 122 extends from an upper surface of the gate electrode 110, along a sidewall of the sidewall spacer structure 314, to an upper surface of the substrate 102. In some embodiments, the substrate 102 may, for example, be a bulk substrate (e.g., a bulk silicon substrate), a silicon-on-insulator (SOI) substrate, or some other suitable substrate and/or may comprise a first doping type (e.g., p-type). A contact region 308 is disposed within the substrate 102 and abuts the source region 104. The drain region 106 and the source region 104 each comprise a second doping type (e.g., n-type) opposite the first doping type. Further, the contact region 308 comprises the first doping type (e.g. p-type) that provides an ohmic connection for the substrate 102 to an overlying contact 120.

In some embodiments, the contact region 308 may have a p-type doping concentration that is approximately $10^{19}$ atoms/cm$^3$ or greater. The contact region 308 is disposed within a body region 306. The body region 306 has the first doping type (e.g., p-type) with a doping concentration that is higher than that of the substrate 102. For example, the substrate 102 may have a doping concentration that is within a range of about $10^{14}$ to $10^{16}$ atoms/cm$^3$, while the body region 306 may have a doping concentration that is within a range of approximately $10^{16}$ to $10^{18}$ atoms/cm$^3$. In further embodiments, the source region 104 is disposed within a shallow well region 310, the shallow well region 310 may comprise the first doping type (e.g., p-type) and/or may have a doping concentration within a range of about $10^{16}$ to $10^{19}$ atoms/cm$^3$. The shallow well region 310 abuts the source region 104 and/or a drift region 114. In some embodiments, the shallow well region 310 may be configured as a channel region in which a conductive channel is formed between the source region 104 and the drift region 114 upon applying suitable bias conditions to the gate electrode 110, the source region 104, and/or the drain region 106.

The drift region 114 is disposed laterally between the source region 104 and the drain region 106. The drift region 114 may comprise the second doping type (e.g., n-type) and/or may have a doping concentration within a range of about $10^{18}$ to $10^{20}$ atoms/cm$^3$. The drift region 114 is disposed within a high voltage well region 304. The high voltage well region 304 may comprise the second doping type (e.g., n-type) with a doping concentration within a range of about $10^{14}$ to $10^{16}$ atoms/cm$^3$. In some embodiments, the drift region 114 is a part of the high voltage well region 304, such that the drift region 114 is omitted (not shown) and the high voltage well region 304 is disposed laterally between the source region 104 and the drain region 106 and functions as a drift region. A shallow well region 312 is disposed around the drain region 106 and is spaced laterally between the first LDMOS device 316 and the second LDMOS device 318. The shallow well region 312 may, for example, comprise the second doping type (e.g., n-type) and may have a doping concentration within a range of about $10^{14}$ to $10^{16}$ atoms/cm$^3$, or another suitable doping concentration. In some embodiments, the drift region 114 continuously laterally extends from the shallow well region 310 to the drain region 106, such that the drift region 114 abuts the drain region 106 (not shown).

A deep well region 302 comprising the first doping type (e.g., p-type) is disposed within the substrate 102 and is disposed directly below the high voltage well region 304. In some embodiments, the deep well region 302 may, for example, have a doping concentration that is within a range of about $10^{14}$ to $10^{16}$ atoms/cm$^3$, or another suitable doping concentration. The deep well region 302 may be configured to enhance formation of a depletion region within the high voltage well region 304 and/or the drift region 114, thereby decreasing a magnitude of the electric field on a surface of the substrate 102. This in part facilitates application of high voltages to the first and/or second LDMOS devices 316, 318. An isolation structure 132 is disposed within the substrate 102 and abuts the drift region 114 and the shallow well region 312. In some embodiments, the isolation structure 132 abuts the high voltage well region 304 (not shown). The isolation structure 132 comprises a different material than the substrate 102 and is disposed laterally between the drain region 106 and the source region 104.

Further, a first inter-level dielectric (ILD) layer 118 is disposed over a top surface of the substrate 102. A plurality of contacts 120 are disposed within the first ILD layer 118 and overlie a doped region of the substrate 102 and/or overlie a conductive structure disposed over a top surface of the substrate 102. In some embodiments, a silicide layer (not shown) is disposed between a contact 120 and a doped region of the substrate 102 directly underlying the contact 120, such that the silicide layer is configured to increase an electrical connection between the contact 120 and the doped region of the substrate 102. The field plate 124 includes a first field plate structure 126 that continuously extends from a top surface of the first ILD layer 118 to an upper surface of the etch stop layer 122. In some embodiments, a first lower edge of the first field plate structure 126 directly overlies the isolation structure 132 and a second lower edge of the first field plate structure 126 is opposite the first lower edge and is laterally offset from the isolation structure 132 by a non-zero distance. In further embodiments, the first lower edge of the first field plate structure 126 is separated from the drain region 106 by a distance, such that the distance is a shortest distance between the field plate 124 and the drain region 106.

Figure 3B:
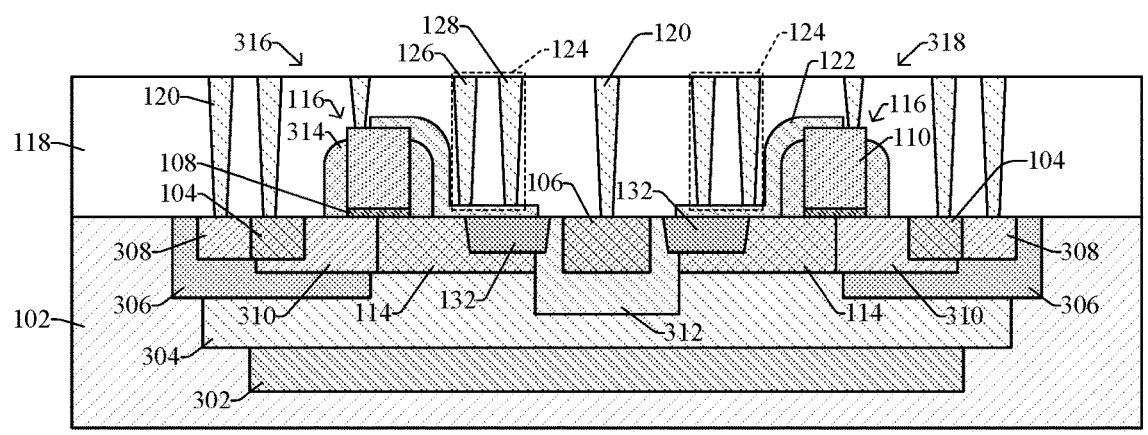

FIG. 3B illustrates a cross-sectional view of an integrated chip 300b according to some alternative embodiments of the integrated chip 300a of FIG. 3A.

In some embodiments, the field plate 124 includes the first field plate structure 126 and a second field plate structure 128. In some embodiments, the second field plate structure 128 is spaced laterally between outer sidewalls of the isolation structure 132. In further embodiments, a first edge of the first field plate structure 126 overlies the isolation structure 132 and a second edge of the first field plate structure 126 is laterally offset from the isolation structure 132 by a non-zero distance.

Figure 3C:
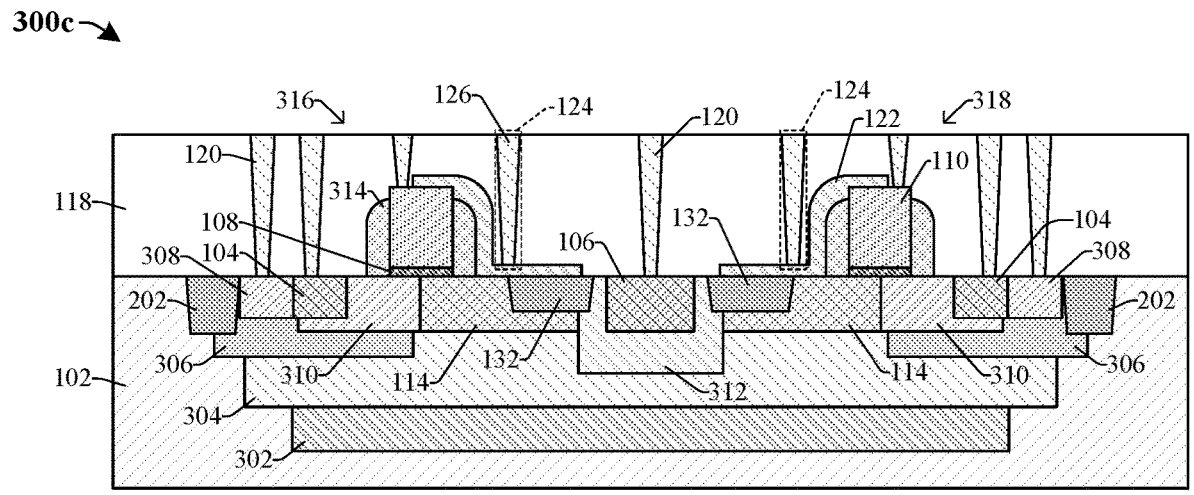

FIG. 3C illustrates a cross-sectional view of an integrated chip 300c according to some alternative embodiments of the integrated chip 300a of FIG. 3A.

A shallow trench isolation (STI) structure 202 extends from the upper surface of the substrate 102 to a first point below the upper surface of the substrate 102. In some embodiments, the STI structure 202 comprises a same material as the isolation structure 132. In further embodiments, the isolation structure 132 extends from the upper surface of the substrate 102 to a second point below the upper surface of the substrate 102, in which the first point is vertically below the second point. The STI structure 202 is configured to electrically isolate the first and/or second LDMOS devices 316, 318 from other semiconductor devices disposed over and/or within the substrate 102.

Figure 3D:
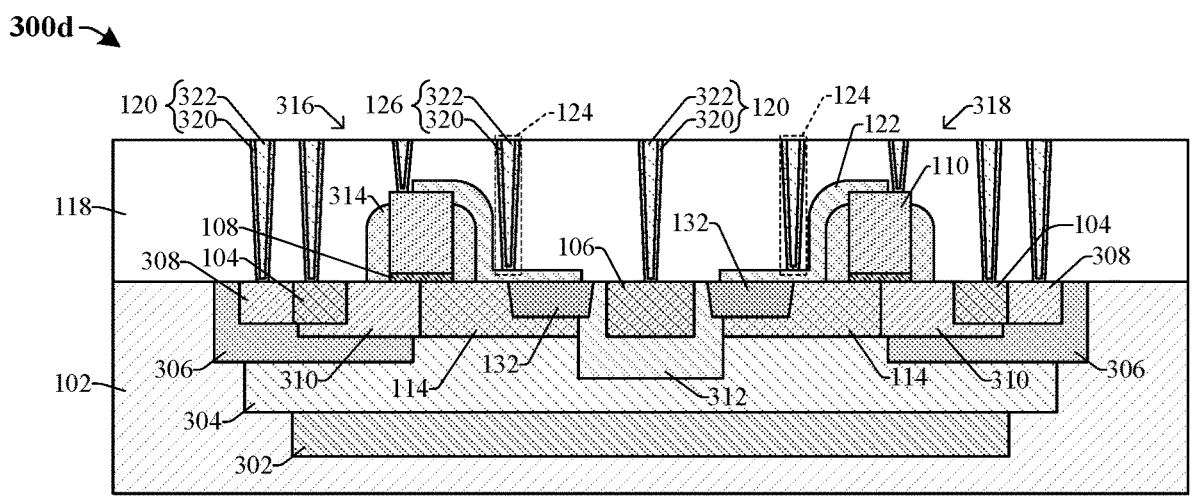

FIG. 3D illustrates a cross-sectional view of an integrated chip 300d according to some alternative embodiments of the integrated chip 300a of FIG. 3A.

The contacts 120 respectively comprise an inner conductive body 322 surrounded by an outer conductive liner 320. In some embodiments, the inner conductive body 322 may, for example, be or comprise tungsten, aluminum, copper, another suitable conductive material, or any combination of the foregoing. In further embodiments, the outer conductive liner 320 may, for example, be or comprise titanium, tantalum, titanium nitride, tantalum nitride, another suitable conductive material, or any combination of the foregoing. In various embodiments, the first field plate structure 126 of the field plate 124 may be configured as the contacts 120, such that the first field plate structure 126 comprises the inner conductive body 322 and the outer conductive liner 320. In yet further embodiments, if the field plate 124 comprises a second field plate structure (e.g., 128 of FIG. 3B) (not shown), then the second field plate structure may comprise the inner conductive body 322 and the outer conductive liner 320.

Figure 3E:
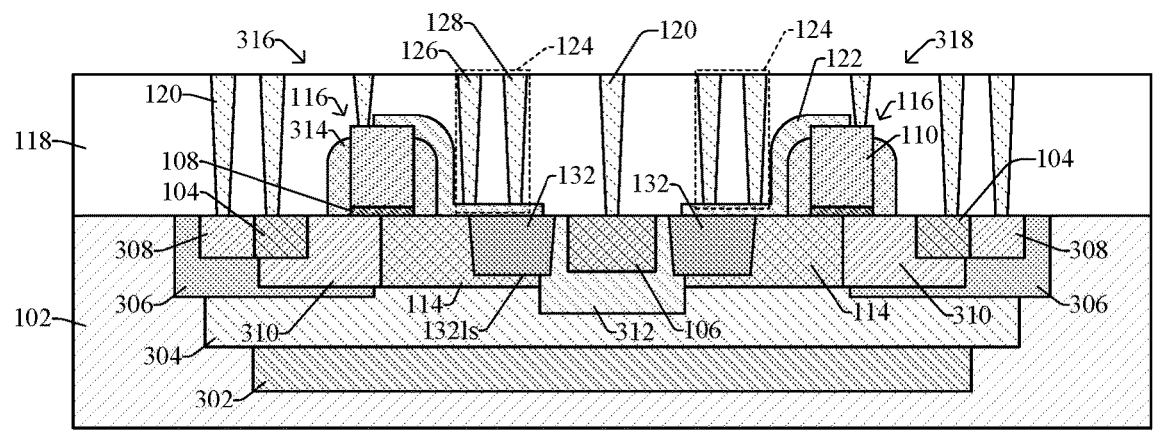

FIG. 3E illustrates a cross-sectional view of an integrated chip 300e according to some alternative embodiments of the integrated chip 300a of FIG. 3A.

In some embodiments, a lower surface 132ls of the isolation structure 132 is disposed vertically beneath the drain region 106, the source region 104, and/or the contact region 308. In various embodiments, this may increase a resistance of the first and/or second LDMOS devices 316, 318, while further decreasing adverse effects of an accumulation of an electric field at an edge of the field plate 124 on the substrate 102.

Figure 3F:
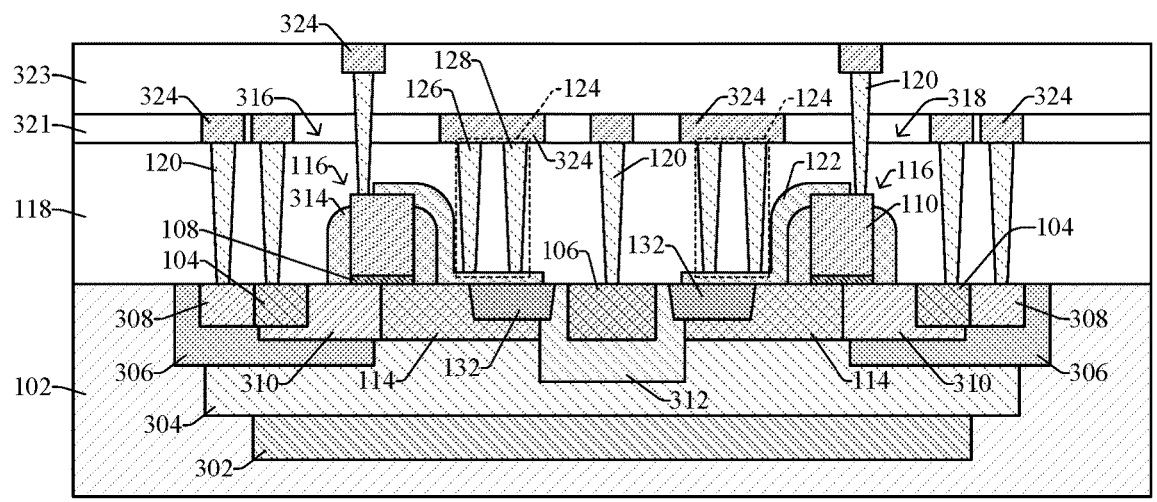

FIG. 3F illustrates a cross-sectional view of an integrated chip 300f according to some alternative embodiments of the integrated chip 300a of FIG. 3A.

In some embodiments, a plurality of conductive wires 324 (e.g., comprising aluminum, copper, tungsten, titanium, tantalum, etc.) overlie the contacts 120. A second ILD layer 321 overlies the first ILD layer 118, and a third ILD layer 323 overlies the second ILD layer 321. In some embodiments, the conductive wires 324 overlying the contacts 120 that are directly electrically coupled to the contact region 308, the source region 104, the drain region 106, and the field plate 124 are disposed within the second ILD layer 321. In further embodiments, the conductive wires 324 overlying the contacts 120 that are directly electrically coupled to the gate electrode 110 are disposed within the third ILD layer 323 and are vertically offset from the second ILD layer 321 by a non-zero distance. Thus, a top surface of each contact 120 (e.g., contacts 120 that respectively overlie source region 104, drain region 106, and/or the contact region 308) and a top surface of the field plate 124 are disposed within a first level that are respectively disposed along a first substantially straight horizontal line, wherein a top surface of each contact 120 disposed within a second level (e.g., contacts 120 that overlie the gate electrode 110) are respectively disposed along a second substantially straight horizontal line that is vertically offset the first substantially straight horizontal line.

FIGS. 4-11 illustrate cross-sectional views 400-1100 of some embodiments of a method of forming an integrated chip including a high voltage LDMOS device having a field plate overlying a buried isolation structure. Although the cross-sectional views 400-1100 shown in FIGS. 4-11 are described with reference to a method, it will be appreciated that the structures shown in FIGS. 4-11 are not limited to the method but rather may stand alone separate of the method. Although FIGS. 4-11 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 4:
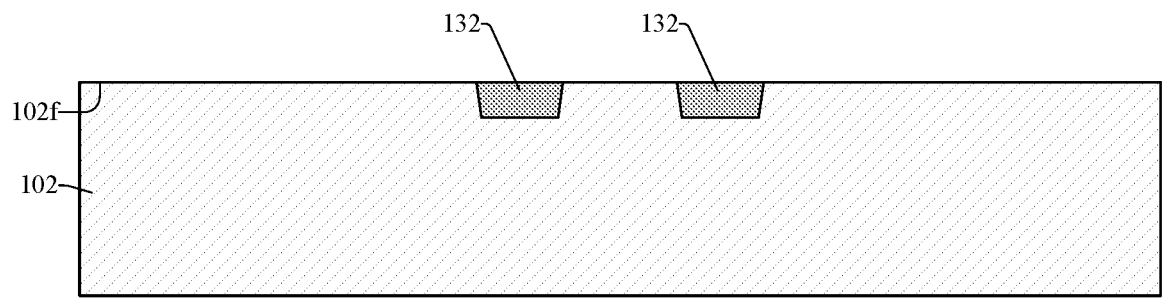
FIGS. 4-11 illustrate cross-sectional views of some embodiments of a method of forming an integrated chip including a high voltage LDMOS device having a field plate over a buried isolation structure.

As shown in cross-sectional view 400 of FIG. 4, a substrate 102 is provided and isolation structures 132 are formed on a front-side 102f of the substrate 102. In some embodiments, the substrate 102 may, for example, be a semiconductor substrate material (e.g., silicon), a bulk substrate (e.g., a bulk silicon substrate), a silicon-on-insulator (SOI) substrate, or some other suitable substrate. In some embodiments, before forming the isolation structures 132, an implant process is performed to dope the substrate 102 with a first doping type (e.g., p-type). In some embodiments, a process for forming the isolation structure 132 may include: forming a masking layer (not shown) over the front-side 102f of the substrate; selectively etching the substrate 102 according to the masking layer to form an opening that extends from the front-side 102f to a point below the front-side 102f; filling (e.g., by chemical vapor deposition (CVD), physical vapor deposition (PVD), atomic layer deposition (ALD), thermal oxidation, etc.) the opening with a dielectric material; and performing a removal process to remove the masking layer. In some embodiments, after filling the opening with the dielectric material, a planarization process (e.g., a chemical mechanical planarization (CMP) process) may be performed on the dielectric material, thereby defining the isolation structure 132. In various embodiments, the planarization process may be performed on the dielectric material such that it continues after reaching the front-side 102f of the substrate, thereby removing at least a small portion of the substrate 102. In yet further embodiments, the planarization process may be performed on the dielectric material until the front-side 102f of the substrate 102 is reached. In some embodiments, the dielectric material is different than the semiconductor substrate material. In further embodiments, the dielectric material may, for example, be or comprise silicon dioxide, silicon nitride, silicon carbide, some other suitable dielectric material, or any combination of the foregoing. In yet further embodiments, a shallow trench isolation (STI) structure (e.g., 202 of FIG. 3C) (not shown) may be formed on the front-side 102f of the substrate 102. In some embodiments, the STI structure may be formed concurrently with the isolation structure 132 and/or comprises the dielectric material. In some embodiments, the p-type dopants of the first doping type may, for example, be or comprise boron, difluoroboron (e.g., $BF_2$), indium, some other suitable p-type dopants, or any combination of the foregoing.

Figure 5:
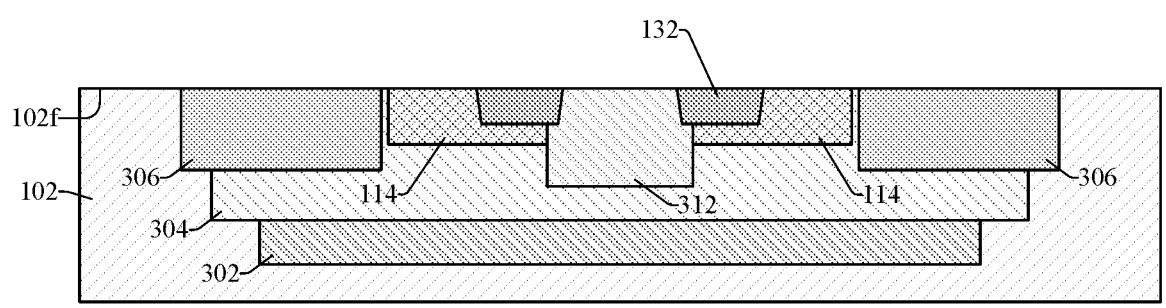

As shown in cross-sectional view 500 of FIG. 5, one or more implantation processes may be performed on the substrate 102 to form one or more doped regions within the substrate 102. In some embodiments, the one or more implantation processes may be performed to form a deep well region 302, a high voltage well region 304, a body region 306, a drift region 114, and/or a shallow well region 312. In some embodiments, the deep well region 302, the high voltage well region 304, the shallow well region 312, and/or the drift region 114 may each comprise a second doping type (e.g., n-type) opposite the first doping type. In some embodiments, the first doping type is p-type and the second doping type is n-type, or vice versa. In yet further embodiments, the deep well region 302 and/or the body region 306 may each comprise the first doping type (e.g., p-type). In some embodiments, the one or more implantation processes may each include: forming a masking layer (not shown) over the front-side 102f of the substrate 102; selectively implanting dopants according to the masking layer into the substrate 102; and performing a removal process to remove the masking layer. In some embodiments, the n-type dopants of the second doping type may, for example, be or comprise phosphorous, arsenic, antimony, some other suitable n-type dopants, or any combination of the foregoing.

In some embodiments, the drift region 114 and/or the high voltage well region 304 may each have a doping concentration that is about $2.0*10^{14}$ atoms/cm$^3$, $2.5*10^{14}$ atoms/cm$^3$, $3.0*10^{14}$ atoms/cm$^3$, $5.7*10^{14}$ atoms/cm$^3$, or within a range of about $10^{14}$ to $10^{15}$ atoms/cm$^3$, or some other suitable doping concentration. In some embodiments, the deep well region 302 may have a doping concentration that is about $1.5*10^{14}$ atoms/cm$^3$, $1.0*10^{15}$ atoms/cm$^3$, within a range of about $10^{14}$ to $10^{16}$ atoms/cm$^3$, or some other suitable doping concentration. In some embodiments, the shallow well region 312 may have a doping concentration that is about $7.0*10^{14}$ atoms/cm$^3$, $1.0*10^{15}$ atoms/cm$^3$, $1.12*10^{15}$ atoms/cm$^3$, within a range of about $10^{14}$ to $10^{16}$ atoms/cm$^3$, or some other suitable doping concentration. In some embodiments, the body region 306 may have a doping concentration that is about $5.0*10^{14}$ atoms/cm$^3$, $8.0*10^{14}$ atoms/cm$^3$, $1.4*10^{15}$ atoms/cm$^3$, within a range of about $10^{14}$ to $10^{16}$ atoms/cm$^3$, or some other suitable doping concentration.

Figure 6:
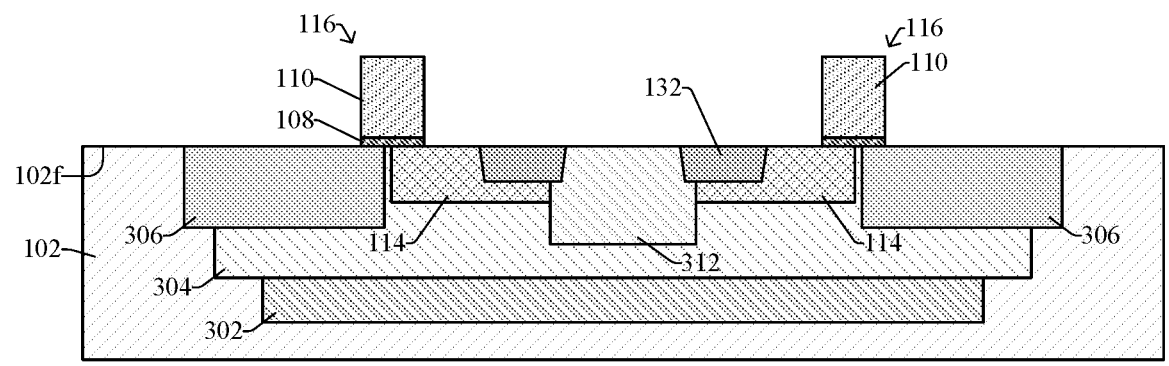

As shown in cross-sectional view 600 of FIG. 6, gate structures 116 are formed over the front-side 102f of the substrate. In some embodiments, the gate structure 116 includes a gate dielectric layer 108 and a gate electrode 110 overlying the gate dielectric layer 108. In some embodiments, a process for forming the gate structures 116 may include: depositing a gate dielectric film over the front-side 102f by, for example, CVD, PVD, ALD, or another suitable deposition process; depositing a gate electrode layer over the gate dielectric film by, for example, CVD, PVD, ALD, sputtering, or another suitable deposition or growth process; and patterning the gate dielectric film and gate electrode layer by a masking layer (not shown) to define the gate dielectric layer 108, the gate electrode 110, and the gate structures 116. In some embodiments, the gate electrode 110 may, for example, be or comprise titanium nitride, tantalum nitride, titanium, tantalum, tungsten, aluminum, copper, polysilicon, intrinsic polysilicon, doped polysilicon, another suitable conductive material, or any combination of the foregoing. In further embodiments, the gate dielectric layer 108 may, for example, be or comprise silicon dioxide, a high-k dielectric material, another suitable gate dielectric material, or any combination of the foregoing.

Figure 7:
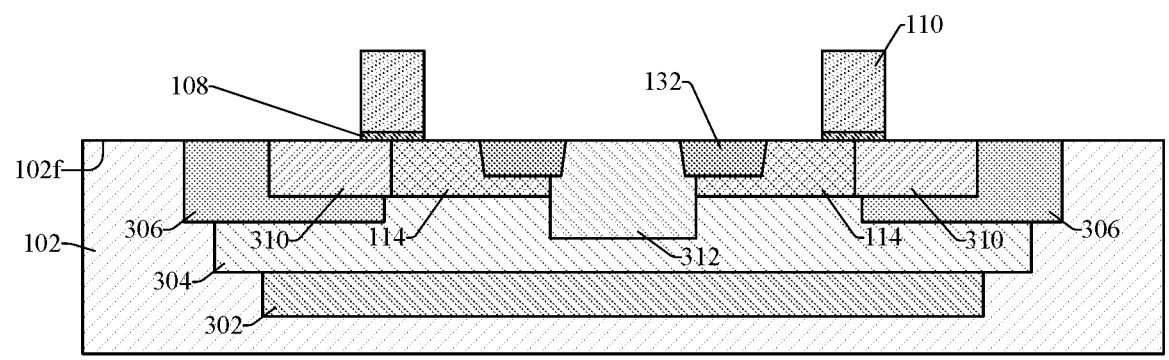

As shown in cross-sectional view 700 of FIG. 7, an implantation process is performed on the substrate 102 to form a shallow well region 310 within the substrate 102. In further embodiments, a plurality of lightly-doped regions (not shown) may be formed concurrently with the shallow well region 310. In some embodiments, the shallow well region 310 abuts the body region 306, the drift region 114, and/or the high voltage well region 304. The shallow well region 310 may, for example, comprise the first doping type (e.g., p-type). In further embodiments, the implantation process includes: forming a masking layer (not shown) over the substrate 102; selectively implanting dopants into the substrate 102 according to the masking layer; and performing a removal process to remove the masking layer. In further embodiments, the shallow well region 310 may be configured as a channel region. In some embodiments, the shallow well region 310 may have a doping concentration that is about $1.0*10^{15}$ atoms/cm$^3$, $1.6*10^{15}$ atoms/cm$^3$, $5.4*10^{15}$ atoms/cm$^3$, $5.0*10^{16}$ atoms/cm$^3$, within a range of about $10^{15}$ to $10^{17}$ atoms/cm$^3$, or some other suitable doping concentration.

Figure 8:
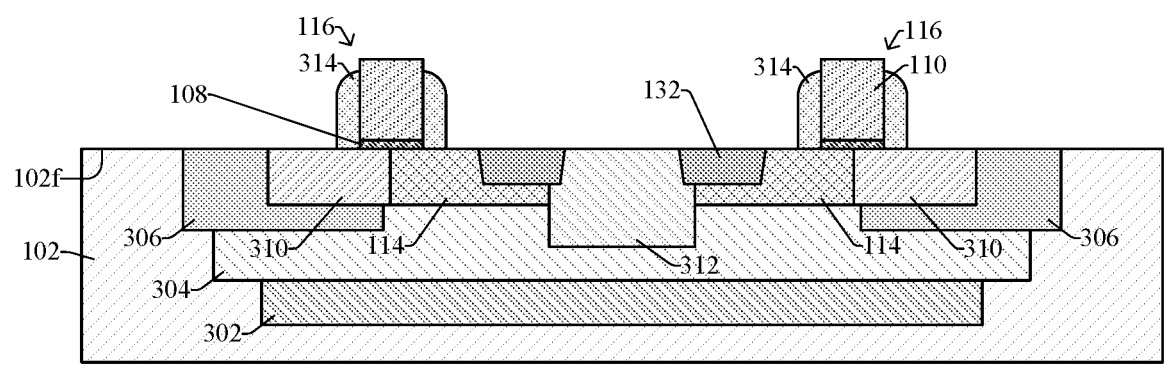

As shown in cross-sectional view 800 of FIG. 8, a sidewall spacer structure 314 is formed around sidewalls of the gate structures 116. In some embodiments, the sidewall spacer structure 314 may, for example, be or comprise silicon nitride, silicon carbide, another suitable dielectric material, or any combination of the foregoing. In further embodiments, a process for forming the sidewall spacer structure 314 may include: depositing (e.g., by a CVD process, a PVD process, an ALD process, or another suitable deposition process) a sidewall spacer layer over the substrate 102 and the gate structures 116; and performing a patterning process on the sidewall spacer layer to remove the sidewall spacer layer from horizontal surfaces, thereby defining the sidewall spacer structure 314.

Figure 9:
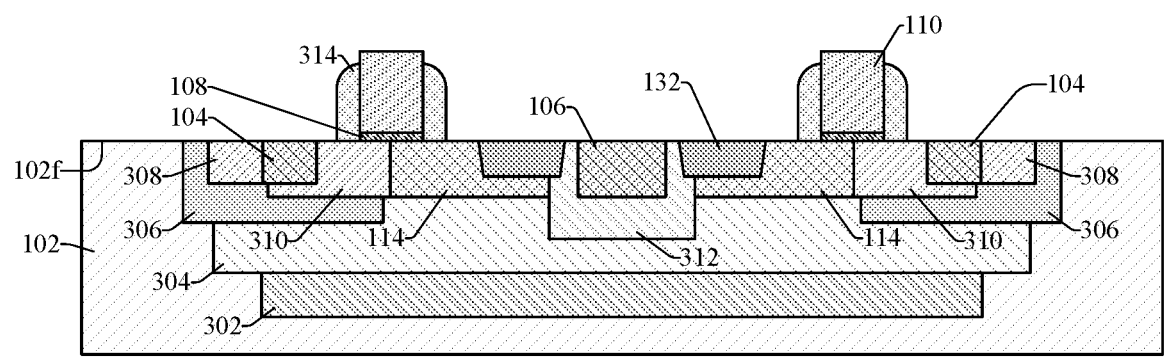

As shown in cross-sectional view 900 of FIG. 9, an implantation process is performed on the substrate 102 to define a source region 104, a drain region 106, and a contact region 308 within the substrate 102. In some embodiments, the source region 104 and/or the drain region 106 may comprise the second doping type (e.g., n-type). In further embodiments, the contact region 308 may comprise the first doping type (e.g., p-type). In various embodiments, the implantation process may include: forming a masking layer (not shown) over the front-side 102f of the substrate 102; selectively implanting dopants into the substrate 102 according to the masking layer; and performing a removal process to remove the masking layer. In some embodiments, the source region 104 and/or the drain region 106 may each have doping concentrations of about $2.5*10^{17}$ atoms/cm$^3$, $2.88*10^{17}$ atoms/cm$^3$, $5.5*10^{17}$ atoms/cm$^3$, within a range of about $10^{17}$ to $10^{19}$ atoms/cm$^3$, greater than about $10^{19}$ atoms/cm$^3$, or some other suitable doping concentration. In some embodiments, the contact region 308 may have a doping concentration that is about $3.0*10^{15}$ atoms/cm$^3$, $3.2*10^{17}$ atoms/cm$^3$, within a range of about $10^{15}$ to $10^{18}$ atoms/cm$^3$, or some other suitable doping concentration.

Figure 10:
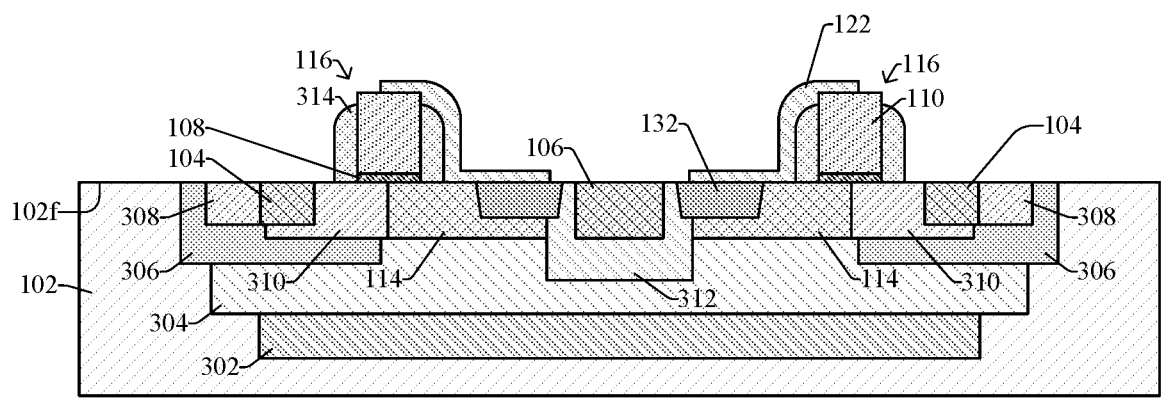

As shown in cross-sectional view 1000 of FIG. 10, an etch stop layer 122 is formed over the gate structures 116. In some embodiments, the etch stop layer 122 continuously extends from an upper surface of the gate electrode 110, along a sidewall of the sidewall spacer structure 314, to the front-side 102f of the substrate 102. In some embodiments, the etch stop layer 122 may, for example, be or comprise silicon nitride, silicon carbide, another suitable dielectric material, or any combination of the foregoing. In further embodiments, the etch stop layer 122 may directly contact the isolation structure 132. In yet further embodiments, the etch stop layer 122 may, for example, be deposited by PVD, CVD, ALD, or another suitable deposition or growth process.

Figure 11:
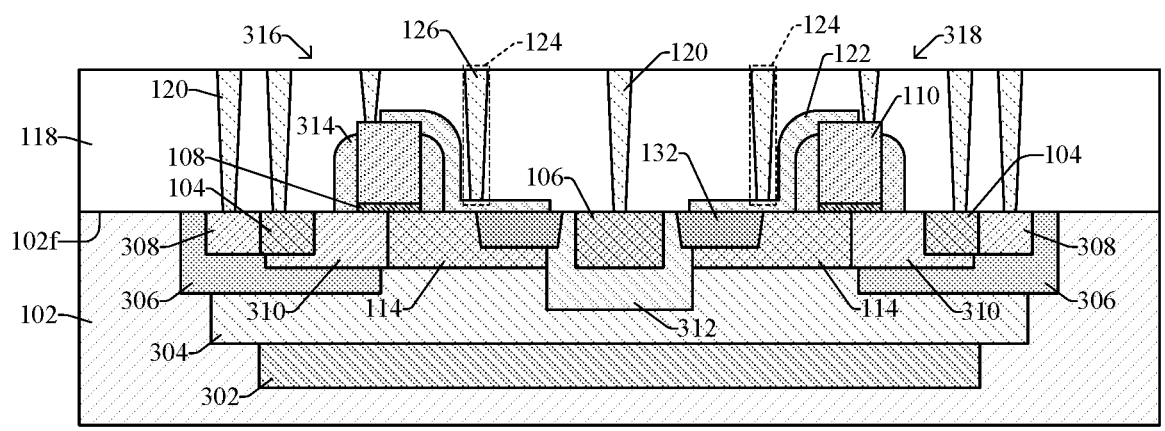

As shown in cross-sectional view 1100 of FIG. 11, a first inter-level dielectric (ILD) layer 118 is formed over the substrate 102. In some embodiments, the first ILD layer 118 may, for example, be deposited by CVD, PVD, ALD, or another suitable deposition process. In further embodiments, the first ILD layer 118 may, for example, be or comprise silicon dioxide, a low-k dielectric material, an extreme low-k dielectric material, another suitable dielectric material, or any combination of the foregoing. Further, after forming the first ILD layer 118, a plurality of contacts 120 and field plates 124 may be formed within the first ILD layer 118, thereby defining a first laterally diffused metal-oxide semiconductor field-effect transistor (MOSFET) (LDMOS) device 316 and a second LDMOS device 318. In some embodiments, the plurality of contacts 120 and the field plates 124 may be formed concurrently. In various embodiments, a process for forming the contacts 120 and/or the field plates 124 may include: forming a masking layer (not shown) over the first ILD layer 118; patterning the first ILD layer 118 according to the masking layer, thereby defining a plurality of openings within the first ILD layer 118; filling the plurality of openings with a conductive material (e.g., titanium, copper, aluminum, tungsten, tantalum nitride, another suitable conductive material, or any combination of the foregoing); and performing a planarization process (e.g., a chemical mechanical planarization (CMP) process) into the conductive material, thereby defining the contacts 120 and/or the field plates 124. In further embodiments, the contacts 120 and/or the field plates 124 may each be formed by a single damascene process.

In some embodiments, the field plate 124 is formed in a manner such that it directly overlies at least a portion of the isolation structure 132. Further, the field plate 124 is separated from the substrate 102 and/or the isolation structure 132 by the etch stop layer 122. In various embodiments, the field plate 124 may include a first field plate structure 126 and/or a second field plate structure (not shown) (e.g., 128 of FIG. 3B). In such embodiments, the first field plate structure 126 and/or the second field plate structure (not shown) (e.g., 128 of FIG. 3B) may be formed concurrently.

Figure 12:
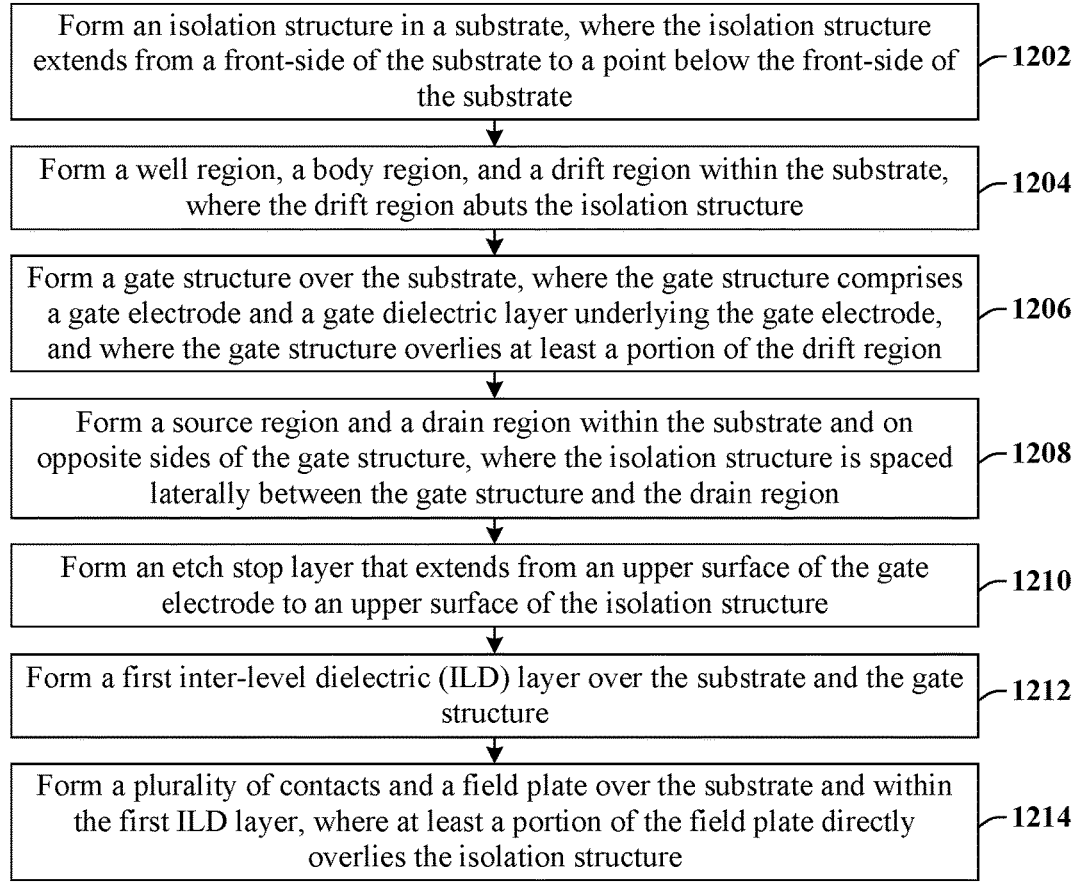
FIG. 12 illustrates a methodology in flowchart format that illustrates some embodiments of a method of forming a high voltage LDMOS device having a field plate over a buried isolation structure.

FIG. 12 illustrates a method 1200 of forming an integrated chip including a LDMOS device having a field plate overlying an isolation structure. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, an isolation structure is formed in a substrate, where the isolation structure extends from a front-side of the substrate to a point below the front-side of the substrate. FIG. 4 illustrates a cross-sectional view 400 corresponding to some embodiments of act 1202.

At act 1204, a well region, a body region, and a drift region are formed within the substrate, where the drift region abuts the isolation structure. FIG. 5 illustrates a cross-sectional view 500 corresponding to some embodiments of act 1204.

At act 1206, a gate structure is formed over the substrate, where the gate structure comprises a gate electrode and a gate dielectric layer underlying the gate electrode. The gate structure overlies at least a portion of the drift region. FIG. 6 illustrates a cross-sectional view 600 corresponding to some embodiments of act 1206.

At act 1208, a source region and a drain region are formed within the substrate on opposite sides of the gate structure. The isolation structure is spaced laterally between the gate structure and the drain region. FIG. 9 illustrates a cross-sectional view 900 corresponding to some embodiments of act 1208.

At act 1210, an etch stop layer is formed over the gate electrode and the substrate, where the etch stop layer extends from an upper surface of the gate electrode to an upper surface of the isolation structure. FIG. 10 illustrates a cross-sectional view 1000 corresponding to some embodiments of act 1210.

At act 1212, a first inter-level dielectric (ILD) layer is formed over the substrate and the gate structure. FIG. 11 illustrates a cross-sectional view 1100 corresponding to some embodiments of act 1212.

At act 1214, a plurality of contacts and a field plate are formed over the substrate and within the first ILD layer, in which at least a portion of the field plate directly overlies the isolation structure. FIG. 11 illustrates a cross-sectional view 1100 corresponding to some embodiments of act 1214.

Accordingly, in some embodiments, the present disclosure relates to a high voltage device having a field plate that at least partially directly overlies an isolation structure that is disposed within a drift region.

In some embodiments, the present application provides an integrated chip, including a gate electrode overlying a substrate between a source region and a drain region; an etch stop layer laterally extending from an upper surface of the gate electrode to a front-side of the substrate, wherein the etch stop layer overlies a drift region disposed between the source region and the drain region; a field plate disposed within a first inter-level dielectric (ILD) layer overlying the substrate, wherein the field plate extends from a top surface of the first ILD layer to an upper surface of the etch stop layer; and an isolation structure disposed within the substrate and extending from the front-side of the substrate to a point below the front-side of the substrate, wherein the isolation structure is disposed laterally between the gate electrode and the drain region, and wherein the field plate overlies the isolation structure.

In some embodiments, the present application provides an integrated chip, including a first laterally diffused metal-oxide semiconductor field-effect transistor (MOSFET) (LDMOS) device including a first gate structure overlying a substrate, wherein the first LDMOS device further includes a first source region and a first drift region disposed within the substrate; a second LDMOS device including a second gate structure, a second source region, and a second drift region; a drain region disposed between the first and second LDMOS devices, wherein the first drift region is disposed between the first source region and the drain region, and wherein the second drift region is disposed between the second source region and the drain region; a first field plate spaced laterally between the drain region and the first gate structure; and a first isolation structure disposed within the substrate, wherein the first isolation structure is spaced laterally between the drain region and the first source region, wherein a first edge of the first field plate directly overlies the first isolation structure and a second edge of the first field plate is laterally offset from the first isolation structure by a non-zero distance in a direction towards the first gate structure.

In some embodiments, the present application provides a method including forming an isolation structure within a substrate, wherein the isolation structure comprises a dielectric material and the substrate comprises a substrate material different than the dielectric material; performing an implant process to form a drift region within the substrate, wherein the drift region abuts the isolation structure; forming a gate structure over the substrate, wherein the gate structure at least partially overlies the drift region; performing an implant process to form a source region and a drain region within the substrate, wherein the drift region is disposed laterally between the source region and the drain region; forming a first inter-level dielectric (ILD) layer over the substrate; and forming a field plate over the drift region and within the ILD layer, wherein at least a portion of the field plate directly overlies the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a gate electrode overlying a substrate between a source region and a drain region;
   an etch stop layer laterally extending from an upper surface of the gate electrode to a front-side of the substrate, wherein the etch stop layer overlies a drift region disposed between the source region and the drain region;
   a field plate disposed within a first inter-level dielectric (ILD) layer overlying the substrate, wherein the field plate comprises a first field plate structure and a second field plate structure that respectively extend from a top surface of the first ILD layer to an upper surface of the etch stop layer, wherein the second field plate structure is laterally offset from the first field plate structure by a non-zero distance; and
   an isolation structure disposed within the substrate and extending from the front-side of the substrate to a point below the front-side of the substrate, wherein the isolation structure is disposed laterally between the gate electrode and the drain region, and wherein the field plate overlies the isolation structure.

2. The integrated chip of claim 1, wherein the isolation structure comprises a first material and the substrate comprises a second material different than the first material.

3. The integrated chip of claim 2, wherein the first material is silicon dioxide, silicon nitride, silicon carbide, silicon oxy-nitride, or silicon oxy-carbide, and the second material is silicon.

4. The integrated chip of claim 1, wherein the gate electrode comprises a first conductive material and the field plate comprises a second conductive material different than the first conductive material.

5. The integrated chip of claim 1, further comprising:
   a plurality of contacts disposed within the first ILD layer and overlying the substrate, wherein a top surface of the plurality of contacts is aligned with a top surface of the field plate.

6. The integrated chip of claim 1,
   wherein at least a portion of the second field plate structure directly overlies the isolation structure.

7. The integrated chip of claim 6, wherein the first field plate structure is laterally offset from the isolation structure by a non-zero distance in a direction towards the gate electrode.

8. The integrated chip of claim 6, wherein outer sidewalls of the second field plate structure are spaced laterally between outer sidewalls of the isolation structure.

9. The integrated chip of claim 6, wherein the first field plate structure directly contacts a sidewall of the etch stop layer.

10. An integrated chip, comprising:
    a first laterally diffused metal-oxide semiconductor field-effect transistor (MOSFET) (LDMOS) device comprising a first gate structure overlying a substrate, wherein the first LDMOS device further comprises a first source region and a first drift region disposed within the substrate;
    a second LDMOS device comprising a second gate structure, a second source region, and a second drift region;
    a drain region disposed between the first and second LDMOS devices, wherein the first drift region is disposed between the first source region and the drain region, and wherein the second drift region is disposed between the second source region and the drain region;
    a first field plate spaced laterally between the drain region and the first gate structure;
    a first isolation structure disposed within the substrate, wherein the first isolation structure is spaced laterally between the drain region and the first source region, wherein a first edge of the first field plate directly overlies the first isolation structure and a second edge of the first field plate is laterally offset from the first isolation structure by a non-zero distance in a direction towards the first gate structures;
    a second field plate spaced laterally between the drain region and the second gate structure; and
    a second isolation structure disposed within the substrate, wherein the second isolation structure is spaced laterally between the drain region and the second source region, wherein a first edge of the second field plate directly overlies the second isolation structure.

11. The integrated chip of claim 10, wherein a lower surface of the first isolation structure is disposed vertically below a lower surface of the drain region.

12. The integrated chip of claim 10, wherein the first isolation structure directly contacts the first drift region.

13. The integrated chip of claim 10, further comprising:
    a first inter-level dielectric (ILD) layer overlying the substrate; and
    a plurality of contacts disposed within the first ILD layer and overlying the substrate, wherein a top surface of the plurality of contacts is aligned with a top surface of the first field plate, wherein the contacts and the first field plate comprise a same material.

14. The integrated chip of claim 10, further comprising:
a first etch stop layer continuously extending from an upper surface of the first gate structure to an upper surface of the substrate, wherein the first field plate directly contacts an upper surface of the first etch stop layer.

15. The integrated chip of claim 14, wherein the first etch stop layer directly contacts the first drift region and directly contacts the first isolation structure.

16. The integrated chip of claim 14, wherein the first etch stop layer comprises a different material than the first isolation structure.

17. A method, comprising:
forming an isolation structure within a substrate, wherein the isolation structure comprises a dielectric material and the substrate comprises a substrate material different than the dielectric material;
performing an implant process to form a drift region within the substrate, wherein the drift region abuts the isolation structure;
forming a gate structure over the substrate, wherein the gate structure at least partially overlies the drift region;
performing an implant process to form a source region and a drain region within the substrate, wherein the drift region is disposed laterally between the source region and the drain region;
forming a first inter-level dielectric (ILD) layer over the substrate; and
forming a field plate over the drift region and within the first ILD layer, wherein at least a portion of the field plate directly overlies the isolation structure, wherein the field plate comprises a first field plate structure and a second field plate structure, and wherein the second field plate structure is laterally offset from the first field plate structure by a non-zero distance.

18. The method of claim 17, further comprising:
forming a plurality of contacts within the first ILD layer and overlying the substrate, wherein the contacts are formed concurrently with the field plate.

19. The method of claim 17, wherein forming the isolation structure comprises:
forming a masking layer over the substrate;
patterning the substrate according to the masking layer, thereby defining an opening that extends from a front-side of the substrate to a point below the front-side of the substrate;
depositing the dielectric material within the opening; and
performing a planarization process on the dielectric material, thereby forming the isolation structure.

20. The method of claim 17, wherein the first field plate structure and the second field plate structure are formed concurrently with one another.

* * * * *